(12) United States Patent
Ichikawa

(10) Patent No.: US 6,611,027 B2
(45) Date of Patent: Aug. 26, 2003

(54) PROTECTION TRANSISTOR WITH IMPROVED EDGE STRUCTURE

(75) Inventor: Kenji Ichikawa, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/140,075

(22) Filed: May 8, 2002

(65) Prior Publication Data

US 2003/0006463 A1 Jan. 9, 2003

(30) Foreign Application Priority Data

Jul. 5, 2001 (JP) ........................................ 2001-204272

(51) Int. Cl.⁷ .............................................. H01L 23/62
(52) U.S. Cl. .................... 257/355; 257/349; 257/356; 257/357; 257/358; 257/382; 257/383; 257/384; 257/347; 438/282; 438/298
(58) Field of Search ................................. 257/355, 349, 257/356, 357, 358, 382, 383, 384, 347; 438/282, 298

(56) References Cited

U.S. PATENT DOCUMENTS 6,140,687 A * 10/2000 Shimomura et al. ........ 257/401

6,333,520 B1 * 12/2001 Inoue .......................... 257/72

FOREIGN PATENT DOCUMENTS

| JP | 06140588 A | 5/1994 |
|----|------------|--------|
| JP | 09129748 A | 5/1997 |

* cited by examiner

Primary Examiner—Sara Crane
Assistant Examiner—Junghwa Im
(74) Attorney, Agent, or Firm—Volentine Francos, PLLC

(57) ABSTRACT

A metal-oxide-semiconductor protection transistor is formed in an active region of a semiconductor layer. The active region includes source and drain diffusion layers, which may be partly silicided, and a body region. A gate electrode extends across the active region above the body region. The breakdown voltage in the edge areas of the active regions is increased by increasing the gate length in the edge areas, by increasing the width of the active region below the gate electrode, or by increasing the non-silicided length of the source and drain diffusion layers in the edge areas. The edge areas of the active region are thereby protected from thermal damage during electrostatic discharges.

12 Claims, 7 Drawing Sheets

PROTECTION TRANSISTOR WITH IMPROVED EDGE STRUCTURE

BACKGROUND OF THE INVENTION

1. Field of the Invention

The present invention relates to a protection transistor, more specifically to a metal-oxide-semiconductor transistor for protecting a semiconductor device from electrostatic damage.

2. Description of the Related Art

Developments in semiconductor fine-patterning technology have increased the integration density and speed of large-scale integrated (LSI) circuits. Recently there has been much interest in silicon-on-insulator (SOI) devices, which combine high speed with low power dissipation. In an SOI device, a thin silicon layer, about five hundred angstroms (500 Å) thick, is formed on a buried oxide (BOX) layer. Circuit elements such as metal-oxide-semiconductor (MOS) transistors formed in the silicon layer are electrically isolated by the BOX layer and by a field oxide formed in the semiconductor layer.

This complete isolation reduces the parasitic capacitance of MOS transistors formed in an SOI device, and the thinness of the silicon layer enables complete or nearly complete channel depletion to be attained, resulting in a sharp operating characteristic. These are the reasons for the low power dissipation and high speed. From the standpoint of reliability, a further advantage is that latch-up does not occur, because no parasitic bipolar transistors are formed. The structure of the MOS transistors in an SOI device, however, places small junction areas in the thin silicon layer, making the MOS transistors extremely vulnerable to thermal damage from current surges caused by electrostatic discharge. Preventing such damage is a key issue in SOI technology.

A known way to protect a semiconductor device from electrostatic discharge is to provide the device with internal protection transistors coupled to its input and output terminals. The protection transistors are MOS transistors that are permanently turned off by interconnection of their source and gate electrodes, but they are designed to be capable of conducting substantial amounts of breakdown current. If an electrostatic surge enters the device at an input or output terminal, the protection transistor breaks down, and the surge current escapes through the protection transistor to ground or the power supply, thereby preventing damage to the device.

The layout of an NMOS (n-channel MOS) transistor in an SOI device is shown in top plan view in FIG. 6A. FIG. 6B is a cross-sectional view through line A-B in FIG. 6A, and FIG. 6C is a cross-sectional view through line C-D in FIG. 6A. The NMOS transistor is formed in an active region 200 having edge areas 200E. The active region 200 includes a pair of n-type diffusion layers 201 formed by diffusion or implantation of an n-type impurity, followed by the formation of a salicide (self-aligned silicide) layer 201M. The n-type diffusion layers 201 include a source diffusion and a drain diffusion, disposed on either side of a p-type body region 202. The p-type body region 202 is disposed below a gate electrode 203, which is insulated from the p-type body region 202 by a gate oxide film 207. An n-type channel forms in the body region 202 when an appropriate voltage is applied to the gate electrode 203. The active region 200 is surrounded by an inactive region 205 comprising a field oxide layer. The active region 200 and inactive region 205 are underlain by a buried oxide (BOX) layer 206, and are covered by an interlayer dielectric film 208. Source and drain electrodes (not shown) make contact with the n-type diffusion layers 201 through two rows of contact holes 204 in the interlayer dielectric film 208.

An example of the layout of a conventional NMOS protection transistor in an SOI device is shown in top plan view in FIG. 7A. FIG. 7B is a cross-sectional view through line A-B in FIG. 7A, and FIG. 7C is a cross-sectional view through line C-D in FIG. 7A. The NMOS protection transistor is formed in an active region 100 having edge areas 100E. The active region 100 includes a pair of n-type diffusion layers 101, forming a source diffusion and a drain diffusion, disposed on either side of a p-type body region 102, in which the channel of the transistor is formed. The p-type body region 102 is disposed beneath a gate electrode 103. Source and drain electrodes (not shown) make contact with the n-type diffusion layers 101 through two rows of contact holes 104 in an interlayer dielectric film 108. A silicide layer 101M is formed in the n-type diffusion layers 101 beneath each row of contact holes 104. The active region 100 is surrounded by an inactive region 105 formed by a field oxide layer, and is underlain by a BOX layer 106. A gate oxide film 107 insulates the gate electrode 103 from the p-type body region 102.

A problem known as the subthreshold hump appears in MOS transistors in an SOI device. The process of isolating the circuit elements creates an extremely thinned silicon layer in the edge areas 200E of the n-type diffusion layer 201 and p-type body region 202, so the threshold voltage becomes lower in the edge areas 200E than in the interior part of the active region 200. The subthreshold operating characteristic therefore departs from a continuous smooth curve and leakage current in the off-state is increased.

An example of this hump effect in the NMOS transistor shown in FIGS. 6A to 6C is illustrated by the current-voltage operating characteristics in FIG. 8A, and by the curve in FIG. 8B, which shows the dependence of the threshold voltage in the edge areas of the active region on the gate width, shown in micrometers ($\mu$m). In FIG. 8A, curve S is the operating characteristic of an NMOS transistor without a hump component, and curve SH is the operating characteristic when a hump is present.

As shown in FIG. 6B, the field oxide film formed in the inactive region 205 in the circuit element isolation process projects into the active region 200, thinning the silicon layer in the edge areas 200E. The projecting oxide is also thinned, by over-etching of a pad oxide film that is formed and removed during the fabrication process. In the edge areas 200E, accordingly, the p-type body region 202 is easily depleted when biased by the gate electrode, and the threshold voltage for channel formation in the edge areas 200E is lowered. The subthreshold operating characteristic of the NMOS transistor is therefore shifted from the hump-free curve S in FIG. 8A to the humped curve SH, increasing the off-state leakage current. The narrower the width of the gate electrodes is, the lower the threshold voltage at the edges of the active region becomes, as shown in FIG. 8B, so in an NMOS transistor with a narrow gate, the hump comes to dominate the subthreshold operating characteristic.

A technique commonly used to prevent this hump effect is the implantation of a channel stop to raise the threshold voltage at the edges of the active region. In this technique, ions are implanted in the edge areas of the active region, near the edges of the source diffusion, the drain diffusion, and the body region of the transistor. The implanted ions are of the same conductive type as the body region and differ from the conductive type of the source diffusion and the drain diffusion; usually, boron is implanted in an NMOS transistor and phosphorus in a PMOS (p-channel MOS) transistor. This channel stop implantation increases the impurity density in the body region near the edges of the active region, making the edge areas of the body region harder to deplete, thus raising the threshold voltage at the edges of the active region and preventing the hump effect.

The formation of a metal-silicide layer on the source and drain diffusions, (e.g., the salicide layer 201M in FIGS. 6A and 6C) is a technique commonly used to reduce the resistance of the source and drain diffusions of a MOS transistor in an SOI device. A salicide layer is a metal-silicide layer that is formed on the source and drain diffusion layers in self-alignment with the gate electrode. Metal-silicide has relatively high conductivity, so the formation of self-aligned silicide layers on the source and drain diffusion layers reduces their resistance.

In the NMOS protection transistor in FIG. 7A, as in the NMOS transistor in FIG. 6A, the silicon layer is thinned in the edge areas 100E of the n-type diffusion layers 101 and the p-type body region 102 (see FIG. 7B), so a channel stop implantation is carried out. In the NMOS protection transistor in FIG. 7A, however, the silicide layer 101M is formed on the n-type diffusion layers 101 only beneath the rows of contact holes 104, instead of being self-aligned with the gate electrode as in the NMOS transistor in FIG. 6A. A non-silicided part of the n-type diffusion layer 101 is thus left between the silicide layer 101M and the p-type body region 102 disposed beneath the gate electrode 103. The reason for leaving this non-silicided area is to avoid having electrostatic discharge current surge across the low-resistance surface interface of the silicon layer, since that would decrease the effective junction area in which breakdown could occur and thus reduce the electrostatic damage protection performance of the protection transistor.

In this conventional protection transistor, however, there is a problem in that the protection transistor itself can easily be damaged by electrostatic surges, due to thermal damage at the edges of the active region. Since the channel stop implantation increases the impurity density in the edge areas of the body region of the protection transistor, although the threshold voltage in these areas is increased, the breakdown voltage is reduced. Consequently, when an electrostatic surge occurs, the outer parts of the active region break down before the interior part, concentrating surge current into the circled areas 110 in FIG. 7A, at the edges of the active region 110 between the silicide layers 101M. That is, these edge areas 110 respond faster than the interior part of the active region 100 to the electrostatic surge. The silicon layer at the edges of the active region is thin and the junction area there is small, so the concentrated surge current can easily cause thermal damage in the circled areas 110.

SUMMARY OF THE INVENTION

An object of the present invention is to provide a protection transistor that offers improved protection from electrostatic damage by avoiding the concentration of breakdown current at the edges of the active region.

The invented protection transistor is an MOS transistor having source and drain diffusion layers of a first conductive type formed in an active region in a semiconductor layer. Between the source and drain diffusion layers there is a body region of a second conductive type, which is disposed below a gate electrode.

According to a first aspect of the invention, the semiconductor layer is covered by a dielectric layer having rows of contact holes disposed above the source and drain diffusion layers. A silicide layer is formed in two strips on the source and drain diffusion layers, one strip disposed below each row of contact holes. The silicide layers are separated from the gate electrode by a greater distance in the edge areas of the active region than in the interior part of the active region. The increased separation increases the breakdown voltage at the edges of the active region, thereby reducing the flow of breakdown current at the edges of the active region.

According to a second aspect of the invention, the gate length of the gate electrode is longer in the edge areas of the active region than in the interior part of the active region. The longer gate length also increases the breakdown voltage and reduces the flow of breakdown current at the edges of the active region.

According to a third aspect of the invention, the semiconductor layer is covered by a dielectric layer having rows of contact holes as described above. The active region is wider beneath the gate electrode than beneath the two rows of contact holes. The edges of the body region thus project beyond the edges of the diffusion layers adjacent the rows of contact holes. This increases the breakdown voltage and reduces the flow of breakdown current in the edge areas of the body region, by moving these areas farther away from the rows of contact holes. The gate length of the gate electrode may also be longer in the edge areas of the active region than in the interior part of the active region.

DETAILED DESCRIPTION OF THE INVENTION

Embodiments of the invention will now be described with reference to the attached drawings.

First Embodiment

Figure 1:
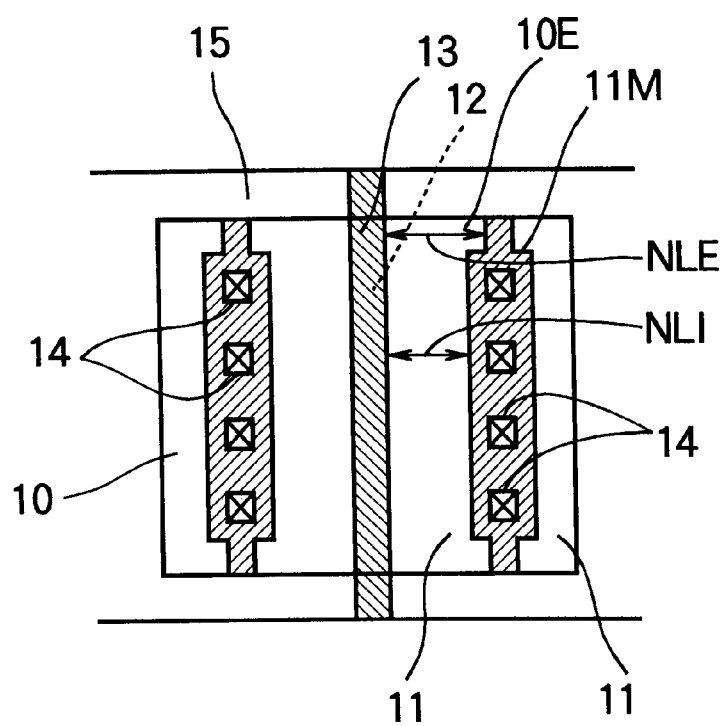
FIG. 1 shows a plan view of the layout of a protection transistor according to a first embodiment of the invention.

The layout of a protection transistor according to a first embodiment of the invention is shown in FIG. 1. The protection transistor is a MOS transistor formed in an active region 10 having edge areas 10E. The edges of interest here are the horizontal edges in the drawing. The active region 10 includes a pair of diffusion layers 11 of a first conductive type, forming a source diffusion and a drain diffusion, disposed on either side of a body region 12 of a second conductive type, in which the channel of the transistor is formed. The body region 12 is covered by a gate electrode 13. Source and drain electrodes (not shown) make contact with the diffusion layers 11 through two rows of contact holes 14 in an overlying dielectric layer (not shown). A silicide layer 11M is formed in the diffusion layer 11 beneath each row of contact holes 14. The active region 10 is surrounded by an inactive region 15 formed by a field oxide layer.

When the first conductive type is n-type and the second conductive type is p-type, the protection transistor in FIG. 1 is an n-channel MOS (NMOS) transistor, the diffusion layers 11 are n-type diffusion layers, and the body region 12 is a p-type body region. If the first conductive type is p-type and the second conductive type is n-type, the protection transistor is a p-channel MOS (PMOS) transistor, the diffusion layers 11 are p-type diffusion layers, and the body region 12 is an n-type body region.

In the protection transistor according to the first embodiment, the silicide layer 11M formed on the diffusion layers 11 beneath each row of contact holes 14 extends to the inactive region 15, but is narrowed in the edge areas 11E of active region, at the ends of the rows of contact holes 14 (more precisely, in the space between the ends of the rows of contact holes 14 and the inactive region 15). Thus the distance from the silicide layer 11M to the gate electrode 13 in the edge areas 10E of the active region is greater than the distance from the silicide layer 11M to the gate electrode 13 in the interior part of the active region (between the edge areas 10E). This distance, which is also the distance from the silicide layer 11M to the body region 12, will be referred below to as the non-silicided length. The feature of the first embodiment is that the non-silicided length NLE in the edge areas of the active region exceeds the non-silicided length NLI in the interior of the active region.

Figure 2A:
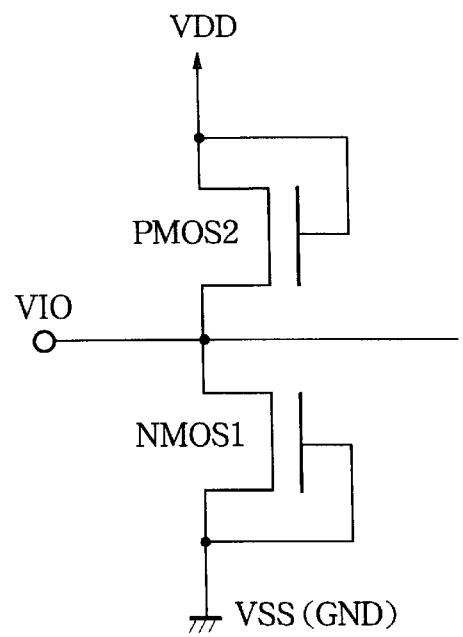
FIG. 2A is a schematic diagram of a protection circuit using the protection transistor of FIG. 1.
Figure 2B:
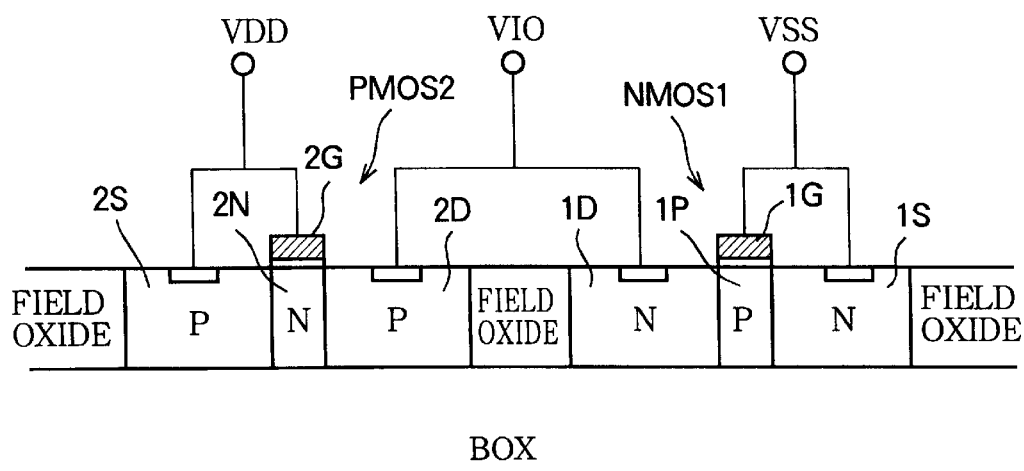
FIG. 2B is a sectional view of the protection circuit in FIG. 2A.

An NMOS protection transistor and a PMOS protection transistor according to the first embodiment can be used to form a protection circuit for protecting a semiconductor device from electrostatic damage. A schematic diagram of the protection circuit in an SOI device is shown in FIG. 2A. FIG. 2B is a sectional view of the protection circuit in FIG. 2A.

In the protection circuit in FIGS. 2A and 2B, the drain 1D (a silicided n-type diffusion layer) of NMOS protection transistor 1 and the drain 2D (a silicided p-type diffusion layer) of PMOS protection transistor 2 are connected to an input/output signal terminal VIO (that is, an input terminal or an output terminal) of the semiconductor device. The source 1S (a silicided n-type diffusion layer) of NMOS protection transistor 1 and its gate electrode 1G are connected to a ground terminal VSS of the semiconductor device, and the source 2S (a silicided p-type diffusion layer) of PMOS protection transistor 2 and its gate electrode 2G are connected to a power-supply terminal VDD of the semiconductor device. The power supply potential is positive with respect to ground. The p-type body region 1P under gate electrode 1G and n-type body region 2N under gate electrode 2G are normally left floating.

When an electrostatic surge of positive potential occurs at input/output signal terminal VIO in FIG. 2B, in NMOS protection transistor 1, the pn junction of the p-type body region 1P and n-type drain 1D breaks down; breakdown current flows out through p-type body region 1P and source 1S to the ground terminal VSS and escapes to ground, thereby protecting the semiconductor device from the electrostatic surge. When an electrostatic surge of negative potential occurs at input/output signal terminal VIO, in PMOS protection transistor 2, the pn junction of n-type body region 2N and p-type drain 2D breaks down; breakdown current flows out through n-type body region 2N and source 2S to the power-supply terminal VDD and escapes to the power supply, thereby protecting the semiconductor device from the electrostatic surge.

In the protection transistor according to the first embodiment, since the non-silicided length NLE, which is the distance from the silicide layer 11M to the gate electrode 13 in the edge areas 10E of the active region, exceeds the corresponding non-silicided length NLI in the interior part of the active region 10, the drain resistance is greater in the edge areas 10E of the active region than in the interior part of the active region 10. Therefore, the edge areas 11E have a structure that is less susceptible to breakdown than the conventional edge structure.

Although the channel stop implantation increases the carrier density in the edge areas of the body region 12, due to the structure in the edge areas, since the breakdown voltage in the edge areas 10E of the active region was originally greater than the breakdown voltage in the interior part of the active region 10, the surge current that flows in the edge areas 10E of the active region when the protection transistor breaks down is reduced, as compared with the conventional structure, thereby offering better protection from electrostatic damage.

A structure with no silicide layer on the diffusion layer 11 in the edge areas at the ends of the rows of the contact holes would also offer better protection from electrostatic damage than the conventional structure, but the effective gate width would be narrower in this structure than in the conventional structure. In the first embodiment, since the silicide layer 11M is also formed at the ends of the rows of the contact holes, (being narrowed but still extending to the inactive region 15), the effective gate width is greater than it would be in a structure with no silicide in the edge areas.

In the protection transistor according to the first embodiment, as described above, since the non-silicided length NLE, which is the distance from the silicide layer 11M to the gate electrode 13 in the edge areas 10E of the active region, exceeds the non-silicided length NLI in the interior of the active region, the surge current that flows in the edge areas 10E of the active region when the protection transistor breaks down is reduced, as compared with the conventional protection transistor, thereby offering better protection from electrostatic damage.

In the protection transistor according to the first embodiment, the non-silicided length NLE from the silicide layer 11M to the gate electrode 13 in the edge areas 10E of the active region was made to exceed the non-silicided length NLI in the interior of the active region by narrowing the silicide layer 11M in the edge areas 10E of the active region, at the ends of the rows of contact holes 14. However, the silicide layer 11M can be formed in other ways so that the non-silicided length NLE exceeds the non-silicided length NLI, thereby offering similar improved protection from electrostatic damage. For example, the silicide layer 11M can be formed so that it curves away from the gate electrode 13 in the edge areas 10E of the active region.

Second Embodiment

Figure 3:
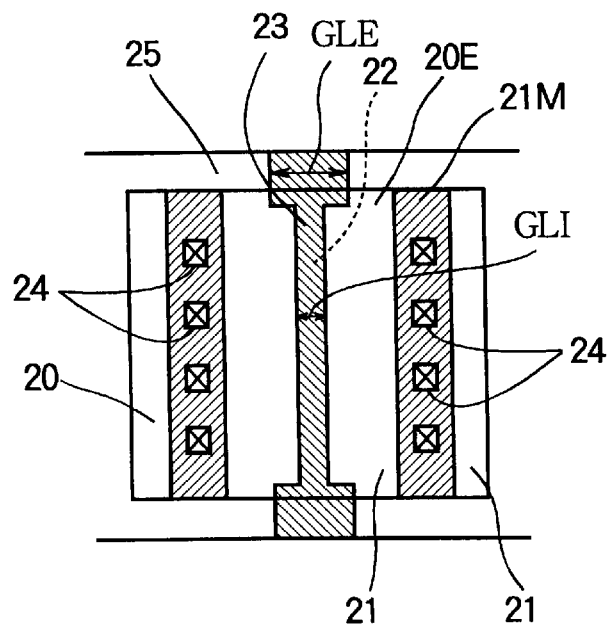
FIG. 3 shows a plan view of the layout of a protection transistor according to a second embodiment of the invention.

The layout of a protection transistor according to a second embodiment of the invention is shown in FIG. 3. The protection transistor is a MOS transistor formed in an active region 20 having edge areas 20E. The edges of interest are again the horizontal edges in the drawing. The active region 20 includes a pair of diffusion layers 21 of a first conductive type, forming a source diffusion and a drain diffusion, disposed on either side of a body region 22 of a second conductive type, in which the channel of the transistor is formed. The body region 22 is covered by a gate electrode 23. Source and drain electrodes (not shown) make contact with the diffusion layers 21 through two rows of contact holes 24 in an overlying dielectric layer (not shown). A silicide layer 21M is formed on the diffusion layer 21 beneath each row of contact holes 24. The active region 20 is surrounded by an inactive region 25 formed by a field oxide layer.

When the first conductive type is n-type and the second conductive type is p-type, the protection transistor in FIG. 3 is an NMOS transistor, the diffusion layers 21 are n-type diffusion layers, and the body region 22 is a p-type body region. If the first conductive type is p-type and the second conductive type is n-type, the protection transistor is a PMOS transistor, the diffusion layers 21 are p-type diffusion layers, and the body region 22 is an n-type body region.

In the protection transistor according to the second embodiment, the silicide layer 21M is formed on the diffusion layers 21 beneath each row of contact holes 24 and extends to the inactive region 25 without narrowing, but the gate electrode 23 and the body region 22 are widened in the edge areas 20E of the active region. Thus the gate length GLE of the gate electrode 23 in the edge areas 20E of the active region is longer than the gate length GLI in the interior of the active region 20 (between the edge areas 20E). This gate length is also the length of the body region 22. The feature of the second embodiment is that the gate length GLE in the edge areas 20E of the active region exceeds the gate length GLI in the interior of the active region 20.

An NMOS protection transistor and a PMOS protection transistor according to the second embodiment can also be used to form a protection circuit for protecting a semiconductor device from electrostatic damage as shown in FIGS. 2A and 2B. When an electrostatic surge of positive potential or negative potential occurs, the NMOS protection transistor or the PMOS protection transistor breaks down and the surge current escapes to ground or the power supply, thereby protecting the semiconductor device from the electrostatic surge as in the first embodiment.

In the protection transistor according to the second embodiment, since the gate length GLE in the edge areas 20E of the active region exceeds the gate length GLI in the interior of the active region 20, and since the body region 22 has substantially the same plan outline as the gate electrode 23, the length of the body region 22 is also greater in the edge areas 20E than in the interior of the active region 20. Because of the longer body length, the rate of carrier recombination in the edge areas of the body region 22 exceeds the rate in the interior of the body region 22. A carrier injected from the drain diffusion layer 21 into the body region 22 near its edge is therefore less likely to reach the source diffusion layer 21 than is a carrier injected into the body region 22 in the interior of the body region 22. Th structure of the second embodiment is thus less susceptible to breakdown in the edge areas 20E of the active region than is the conventional structure.

Although the channel stop implantation increases the carrier density in the edge areas of the body region 22, due to the structure of the edge areas, the breakdown voltage in the edge areas 20E of the active region was originally greater than the breakdown voltage in the interior of the active region 20. Thus the edges areas 20E still do not break down as readily as in the conventional structure, and the surge current that flows in the edge areas 20E of the active region when the protection transistor breaks down is reduced, as compared with the conventional structure, offering better protection from electrostatic damage.

In the protection transistor according to the second embodiment, since the rate of carrier recombination is greater in the edge areas of the body region 22 than in the interior of the body region 22, leakage current in the off-state in the edge areas is also reduced as compared with the conventional protection transistor.

The protection transistor according to the second embodiment thus has two advantages: enhanced protection from thermal damage to the edge areas of the active region during electrostatic surges, because less surge current is concentrated into those areas; and less leakage of current under normal conditions, because less current can pass through the edge areas of the body region 22. Both advantages are obtained because the gate length GLE in the edge areas 20E of the active region exceeds the gate length GLI in the interior of the active region 20 between the edge areas 20E, increasing the body length and hence probability of carrier recombination in the edge areas.

In the protection transistor according to the second embodiment, the silicide layer 21M can be narrowed in the edge areas in the same way as in the first embodiment, to obtain further enhanced protection from electrostatic damage.

Third Embodiment

Figure 4:
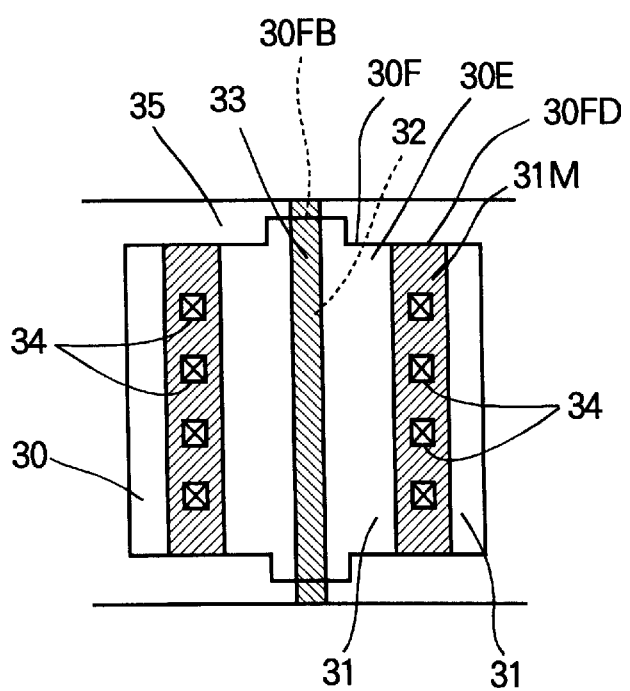
FIG. 4 shows a plan view of the layout of a protection transistor according to a third embodiment of the invention.

The layout of a protection transistor according to a third embodiment of the invention is shown in FIG. 4. The protection transistor is a MOS transistor formed in an active region 30 having edge areas 30E and edges 30F. The edge areas and edges of interest are once again the horizontal edge areas and edges in the drawing. The active region 30 includes a pair of diffusion layers 31 of a first conductive type, forming a source diffusion and a drain diffusion, disposed on either side of a body region 32 of a second conductive type, in which the channel of the transistor is formed. The body region 32 is covered by a gate electrode 33. Source and drain electrodes (not shown) make contact with the diffusion layers 31 through two rows of contact holes 34 in an overlying dielectric layer (not shown). A silicide layer 31M is formed on the diffusion layer 31 beneath each row of contact holes 34. The active region 30 is surrounded by an inactive region 35 formed by a field oxide layer. The edges 30F of the active region include the edges 30FB of the body region 32 and the edges 30FD of the diffusion layers 31 near the rows of contact holes 34. Edges 30FB will also be referred to as the body edges or channel edges.

When the first conductive type is n-type and the second conductive type is p-type, the protection transistor in FIG. 4 is an NMOS transistor, the diffusion layers 31 are n-type diffusion layers, and the body region 32 is a p-type body region. If the first conductive type is p-type and the second conductive type is n-type, the protection transistor is a PMOS transistor, the diffusion layers 31 are p-type diffusion layers, and the body region 32 is an n-type body region.

In the protection transistor according to the third embodiment, the silicide layer 31M is formed on the diffusion layers 31 beneath each row of contact holes 34 and extends to the edges 30FD. The feature of the third embodiment is that the active region 30 is widened in the vicinity of the gate electrode 33. The body edges (channel edges) 30FB and the edges of the diffusion layers 31 near the gate electrode 33 thus project farther into the inactive region 35 than do the edges 30FD of the diffusion layers 31 near the rows of contact holes.

An NMOS protection transistor and a PMOS protection transistor according to the third embodiment can also be used to form a protection circuit for protecting a semiconductor device from electrostatic damage as shown in FIGS. 2A and 2B. When an electrostatic surge of positive potential or negative potential occurs, the NMOS protection transistor or the PMOS protection transistor breaks down and the surge current escapes to ground or the power supply, thereby protecting the semiconductor device from the electrostatic surge, as in the first embodiment.

In the protection transistor according to-the third embodiment, since the body edges (channel edges) 30FB project farther into the inactive region 35 than do the edges 30FD of the diffusion layers 31 near the rows of contact holes, the distance from the projecting areas of the body region 32 to the silicide layer 31M in the edge areas 30E of the active region is greater than the distance from the body region 32 to the silicide layer 31M in the interior of the active region 30 (between the edge areas 30E). That is, the non-silicided distance between the silicide layer 31M and the body region 32 (or its overlying gate electrode 33) is greater in the edge areas 30E of the active region 30 than in the interior of the active region 30. The non-silicided length of the current path from the silicide layer 31M to the body region 32 is thus longer in the edge areas 30E. The drain resistance is therefore greater in the edge areas 30E of the active region than in the interior part of the active region 30. As in the preceding embodiments, accordingly, the edge areas 30E have a structure that is less susceptible to breakdown than is the conventional structure.

Although the channel stop implantation increases the carrier density in the edge areas (the projecting areas) of the body region 32, due to the structure in the edge areas, the breakdown voltage in the edge areas 30E of the active region was originally greater than the breakdown voltage in the interior part of the active region 30, so the surge current that flows in the edge areas 30E of the active region when the protection transistor breaks down is reduced, as compared with the conventional structure, thereby offering better protection from electrostatic damage.

In the protection transistor according to the third embodiment, since the body edges 30FB and the edges of the diffusion layers 31 near the gate electrode 33 project farther into the inactive region 35 than the edges 30FD of the diffusion layers 31, the effective gate width is also greater than in the conventional protection transistor.

The protection transistor according to the third embodiment thus provides improved protection from electrostatic damage in two ways. Since the body edges 30FB project into the inactive region 35 farther than the edges 30FD of the diffusion layer 31, the surge current that flows through the body region 32 near its edges 30FB when the protection transistor breaks down is reduced, as compared with the conventional structure, thereby protecting the protection transistor itself from electrostatic damage. In addition, since the effective gate width and thus the effective channel width is greater than in the conventional protection transistor, more breakdown current can flow through the channel as a whole, providing improved protection from electrostatic damage to other parts of the SOI device.

The protection transistor according to the third embodiment may also have a structure in which only the body edges 30FB project into the inactive region 35.

Fourth Embodiment

Figure 5:
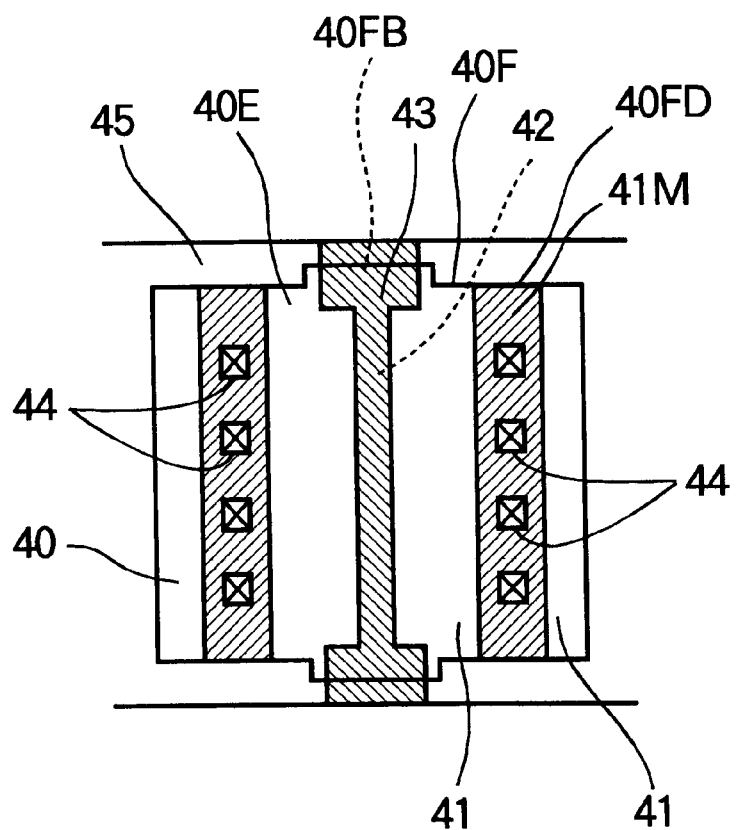
FIG. 5 shows a plan view of the layout of a protection transistor according of a fourth embodiment of the invention.
Figure 6A:
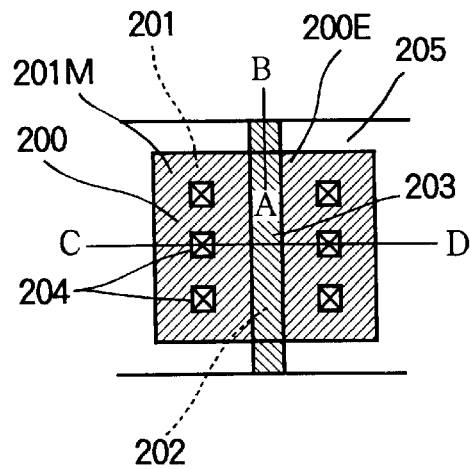
FIG. 6A shows a plan view of the layout of an NMOS transistor in an SOI device.
Figure 6B:
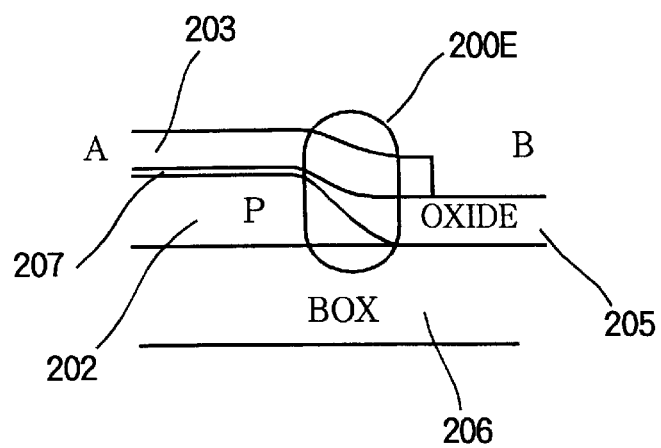
FIG. 6B is a cross-sectional view through line A-B in FIG. 6A.
Figure 6C:
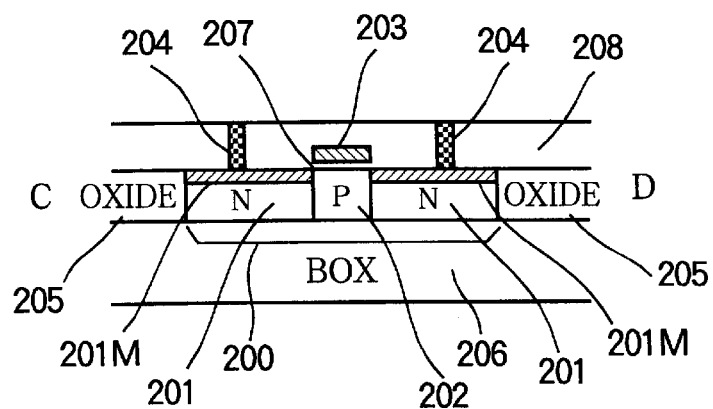
FIG. 6C is a cross-sectional view through line C-D in FIG. 6A.
Figure 7A:
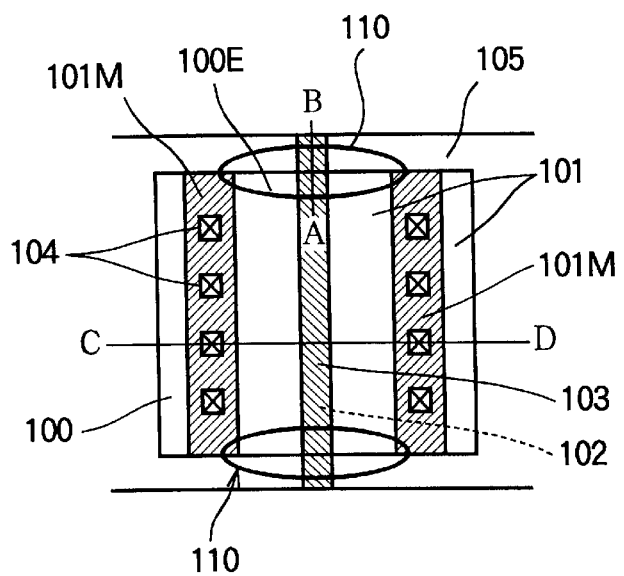
FIG. 7A shows a plan view of the layout of a conventional NMOS protection transistor in an SOI device.
Figure 7B:
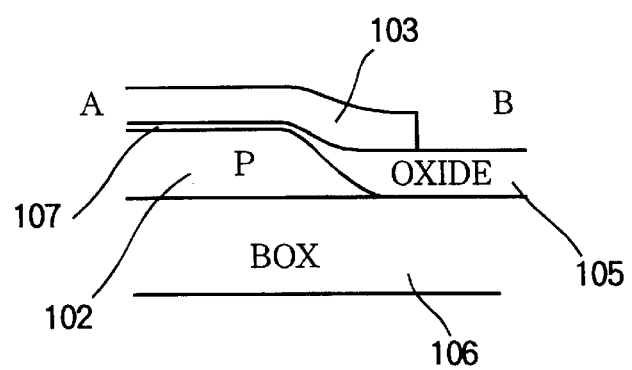
FIG. 7B is a cross-sectional view through line A-B in FIG. 7A.
Figure 7C:
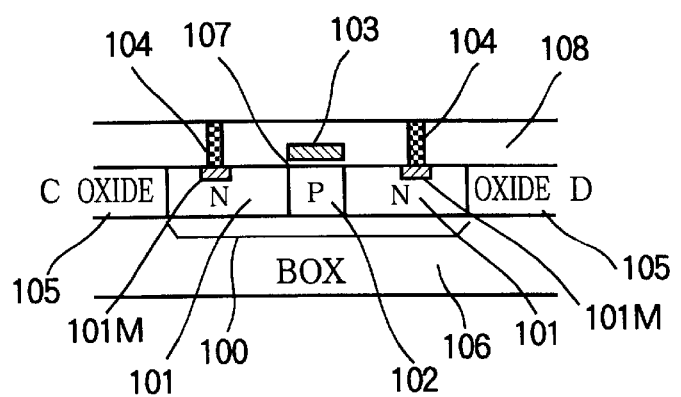
FIG. 7C is a cross-sectional view through line C-D in FIG. 7A.
Figure 8A:
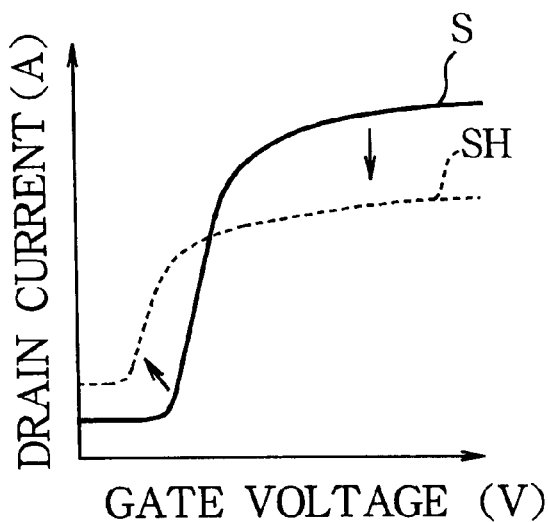
FIG. 8A shows operating characteristics illustrating the hump effect in an NMOS transistor.
Figure 8B:
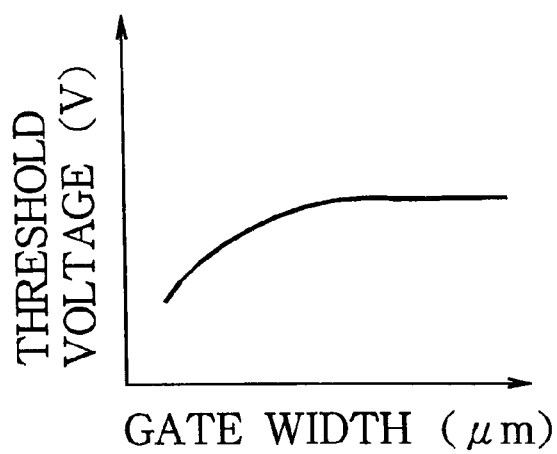
FIG. 8B illustrates the dependence of threshold voltage on gate width in the NMOS transistor in FIG. 6A.

The layout of a protection transistor according to a fourth embodiment of the invention is shown in FIG. 5. The protection transistor is a MOS transistor formed in an active region 40 having edge areas 40E and edges 40F. The edge areas and edges of interest are the horizontal edge areas and edges in the drawing. The active region 40 includes a pair of diffusion layers 41 of a first conductive type, forming a source diffusion and a drain diffusion, disposed on either side of a body region 42 of a second conductive type, in which the channel of the transistor is formed. The body region 42 is covered by a gate electrode 43. Source and drain electrodes (not shown) make contact with the diffusion layers 41 through two rows of contact holes 44 in an overlying dielectric layer (not shown). A silicide layer 41M is formed on the diffusion layer 41 beneath each row of contact holes 44. The active region 40 is surrounded by an inactive region 45 formed by a field oxide layer. The edges 40F of the active region include the edges 40FB of the body region 42 and the edges 40FD of the diffusion layers 41. Edges 40FB will also be referred to as the body edges or channel edges.

The protection transistor according to the fourth embodiment combines the features of the protection transistors of the second and third embodiments. The silicide layer 41M is formed on the diffusion layers 41 beneath each row of contact holes 44 and extends to the edges 40FD without narrowing, but the gate electrode 43 and the body region 42 are widened in the edge areas 40E of the active region. Thus the gate length GLE of the gate electrode 43 in the edge areas 40E of the active region is longer than the gate length GLI in the interior of the active region 40 (between the edge areas 40E). This gate length is also the length of the body region 42. One feature of the fourth embodiment is thus that the gate length GLE in the edge areas 40E of the active region exceeds the gate length GLI in the interior of the active region 40, as in the second embodiment. In addition, the body edges (or channel edges) 40FB and the edges of the diffusion layers 41 near the gate electrode 43 project farther into the inactive region 45 than the edges 40FD of the diffusion layers 41 near the rows of contact holes, as in the third embodiment.

An NMOS protection transistor and a PMOS protection transistor according to the fourth embodiment can also be used to form a protection circuit for protecting a semiconductor device from electrostatic damage as shown in FIGS. 2A and 2B. When an electrostatic surge of positive potential or negative potential occurs, the NMOS protection transistor or the PMOS protection transistor breaks down and the surge current escapes to ground or the power supply, thereby protecting the semiconductor device from the electrostatic surge, as in the first embodiment.

In the protection transistor according to the fourth embodiment, since the gate length GLE in the edge areas 40E of the active region, which is substantially equal to the length of the body region 42 in the edges areas 20E, exceeds the gate length GLI in the interior part of the active region 40, which is substantially equal to the length of the body region 42 in the interior part, the rate of carrier recombination in the edge areas of the body region 42 exceeds the rate in the interior part of the body region 42. A carrier injected into the body region 42 near its edge is therefore less likely to reach the source diffusion than is a carrier injected into the body region 42 in the interior of the body region 42.

In the protection transistor according to the fourth embodiment, since the body edges (channel edges) 40FB project farther into the inactive region 45 than the edges 40FD of the diffusion layers 41 near the rows of contact holes, the distance from the projecting edge areas of the body region 42 to the silicide layer 41M is greater than the distance from the body region 42 to the silicide layer 41M in the interior part of the active region 40. That is, the non-silicided distance between the silicide layer 41M and the body region 42 (or its overlying gate electrode 43) is greater in the edge areas 40E of the active region 40 than in the interior of the active region 40. The non-silicided length of the current path from the silicide layer 41M to the body region 42 is thus longer in the edge areas 40E, so the drain resistance is greater in the edge areas 40E of the active region than in the interior part of the active region 40.

In the protection transistor according to the fourth embodiment, as described above, current flow in the edge areas 40E of the active region is reduced first by increased drain resistance due to the increased non-silicided length from the silicide layer 41M to the body region 42, then by the increased probability of carrier recombination in the body region 42, due to the increased gate length (the increased length of the channel). Therefore, as in the preceding embodiments, the edge areas 40E have a structure that is less susceptible to breakdown than is the conventional structure.

Although the channel stop implantation increases the carrier density in the edge areas of the body region 42, due to the structure in the edge areas, the breakdown voltage in the edge areas 40E of the active region was originally greater than the breakdown voltage in the interior part of the active region 40, so the surge current that flows in the edge areas 40E of the active region when the protection transistor breaks down is reduced, as compared with the conventional structure, thereby offering better protection from electrostatic damage.

In the protection transistor according to the fourth embodiment, since the rate of carrier recombination is greater in the edge areas of the body region 42 than in the interior of the body region 42, leakage current in the off-state in the edge areas is also reduced as compared with the conventional protection transistor. Moreover, since the body edges 40FB and the edges of the diffusion layers 41 near the gate electrode 43 also project into the inactive region 45 farther than the edges b4OFD of the diffusion layers 41 near the rows of contact holes, the effective gate width and thus the effective channel width is greater than in the conventional protection transistor. More breakdown current can therefore flow through the channel, providing still further improved protection from electrostatic damage.

In the protection transistor according to the fourth embodiment, as described above, since the gate length GLE, which is the length of the body region 42, in the edge areas 40E of the active region exceeds the gate length GLI, which is also the length of the body region 42, in the interior of the active region 40 (between the edge areas 40E) and the body edges 40FB project into the inactive region 45 farther than the edges 40FD of the diffusion layer 41, the surge current that flows in the edge areas 40E of the active region when the protection transistor breaks down is reduced, as compared with the conventional structure, thereby offering better protection from electrostatic damage.

In the protection transistor according to the fourth embodiment, the silicide layer 41M can be narrowed in the edge areas in the same way as in the first embodiment, to obtain a still greater degree of protection from electrostatic damage.

All the protection transistors in the preceding embodiments can be used in semiconductor devices produced not only by SOI processes, but also by bulk processes. In all the protection transistors, polysilicon and polycide can be used as the gate electrode material.

In the protection transistor according to the first embodiment of the invention, as described above, the surge current that flows in the edge areas of the active region when the protection transistor breaks down is reduced, as compared with a conventional protection transistor, because the distance from the silicide layer to the gate electrode in the edge areas of the active region exceeds the distance in the interior of the active region.

In the protection transistor according to the second embodiment, the surge current that flows in the edge areas of the active region when the protection transistor breaks down is reduced, as compared with the conventional protection transistor, because the gate length in the edge areas of the active region exceeds the gate length in the interior of the active region.

In the protection transistor according to the third embodiment, the surge current that flows in the edge areas of the active region when the protection transistor breaks down is reduced, as compared with the conventional protection transistor, because the edges of the body region of the second conductive type project farther into the inactive region than the edges of the diffusion layers of the first conductive type.

In the protection transistor according to the fourth embodiment, the surge current that flows in the edge areas of the active region when the protection transistor breaks down is reduced, as compared with the conventional protection transistor, because the body edges of the second conductive type project farther into the inactive region than the edges of the diffusion layers of the first conductive type, and because the gate length in the edge areas of the active region exceeds the gate length in the interior of the active region.

By reducing the surge current that flows in the edge areas of the active region when the protection transistor breaks down, all four embodiments improve the ability of the protection transistor to conduct electrostatic discharge current without suffering thermal damage, thereby enabling the protection transistor to provide better protection from electrostatic damage to the device in which it is used.

A few modifications of the above embodiments have been mentioned, but those skilled in the art will recognize that further variations are possible within the scope of the invention as claimed below.

What is claimed is:

1. A metal-oxide-semiconductor (MOS) protection transistor for preventing electrostatic damage to a semiconductor device, having a semiconductor layer with an active region, a gate electrode extending across the active region, and a dielectric layer covering the semiconductor layer and gate electrode, the active region having edge areas and an interior part, source and drain diffusion layers of a first conductive type being formed in the active region, a body region of a second conductive type being disposed in the active region below the gate electrode and between the source and drain diffusion layers, the dielectric layer having respective rows of contact holes disposed above the source and drain diffusion layers, a silicide layer being formed in two strips, disposed below the rows of contact holes, in the source and drain diffusion layers, wherein:

the two strips of the silicide layer are separated from the gate electrode by a greater distance in the edge areas of the active region than in the interior part of the active region.

2. The MOS protection transistor of claim 1, wherein the two strips of the silicide layer extend completely across the active region.

3. The MOS protection transistor of claim 2, wherein the two strips of the silicide layer are narrower in the edge areas of the active region than in the interior part of the active region.

4. The MOS protection transistor of claim 1, wherein the gate electrode has a gate length that is longer in the edge areas of the active region than in the interior part of the active region.

5. The MOS protection transistor of claim 1, wherein the active region is wider beneath the gate electrode than beneath the rows of contact holes.

6. The MOS protection transistor of claim 1, also having a buried oxide layer disposed below the active region, and a field oxide layer surrounding the active region.

7. A metal-oxide-semiconductor (MOS) protection transistor for preventing electrostatic damage to a semiconductor device, having a semiconductor layer with an active region, a gate electrode extending across the active region, and a dielectric layer covering the semiconductor layer and gate electrode, the active region having edge areas and an interior part, source and drain diffusion layers of a first conductive type being formed in the active region, a body region of a second conductive type being disposed in the active region below the gate electrode and between the source and drain diffusion layers, the dielectric layer having respective rows of contact holes disposed above the source and drain diffusion layers, a silicide layer being formed in two strips, disposed below the rows of contact holes, in the source and drain diffusion layers, wherein:

the gate electrode has a gate length that is longer above the edge areas of the active region than above the interior part of the active region; and the two strips of the silicide layer are narrower in the edge areas of the active region than in the interior part of the active region.

8. The MOS protection transistor of claim 7, wherein the active region is wider beneath the gate electrode than beneath the rows of contact holes.

9. The MOS protection transistor of claim 7, also having a buried oxide layer disposed below the active region, and a field oxide layer surrounding the active region.

10. A metal-oxide-semiconductor (MOS) protection transistor for preventing electrostatic damage to a semiconductor device, having a semiconductor layer with an active region, a gate electrode extending across the active region, and a dielectric layer covering the semiconductor layer and gate electrode, source and drain diffusion layers of a first conductive type being formed in the active region, a body region of a second conductive type being disposed in the active region below the gate electrode and between the source and drain diffusion layers, the dielectric layer having respective rows of contact holes disposed above the source and drain diffusion layers, wherein:

the active region is wider beneath the gate electrode than beneath the rows of contact holes; and the active region has edge areas and an interior part, and a silicide layer is formed in two strips in the source and drain diffusion layers disposed below the rows of contact holes, the two strips of the silicide layer being narrower in the edge areas of the active region than in the interior part of the active region.

11. The MOS protection transistor of claim 10, wherein the gate electrode has a gate length that is greater above the edge areas of the active region than above the interior part of the active region.

12. The MOS protection transistor of claim 10, also having a buried oxide layer disposed below the active region, and a field oxide layer surrounding the active region.

* * * * *